US010871552B1

(12) United States Patent
Fluhler

(10) Patent No.: US 10,871,552 B1
(45) Date of Patent: Dec. 22, 2020

(54) INTERSTITIAL FILTER SYSTEM AND METHOD WITH IMPROVED PERFORMANCE

(71) Applicant: Herbert U. Fluhler, Huntsville, AL (US)

(72) Inventor: Herbert U. Fluhler, Huntsville, AL (US)

( * ) Notice: Subject to any disclaimer, the term of this patent is extended or adjusted under 35 U.S.C. 154(b) by 0 days.

(21) Appl. No.: 16/101,439

(22) Filed: Aug. 11, 2018

Related U.S. Application Data

(63) Continuation-in-part of application No. 14/015,594, filed on Aug. 30, 2013, now abandoned.

(60) Provisional application No. 61/712,803, filed on Oct. 11, 2012.

(51) Int. Cl.
*G01S 7/295* (2006.01)
*G01S 13/58* (2006.01)
*G01S 13/53* (2006.01)
*H03H 17/02* (2006.01)

(52) U.S. Cl.
CPC ............ *G01S 7/295* (2013.01); *G01S 13/582* (2013.01); *G01S 13/53* (2013.01); *H03H 17/0266* (2013.01)

(58) Field of Classification Search
None
See application file for complete search history.

(56) References Cited

U.S. PATENT DOCUMENTS

| | | | | |
|---|---|---|---|---|
| 5,343,208 A | * | 8/1994 | Chesley | G01S 13/5244 342/196 |
| 7,911,375 B2 | * | 3/2011 | Winstead | G01C 5/005 342/120 |
| 8,761,280 B1 | * | 6/2014 | Harris | H04L 27/2602 375/259 |
| 2013/0342386 A1 | * | 12/2013 | Dai | G01S 7/292 342/179 |

OTHER PUBLICATIONS

Chu, "Quadrature Mirror Filter Design for an Arbitrary Number of Equal Bandwidth Channels" IEEE Transactions on Acoustics, Speech, and Signal Processing, vol. ASSP-33, No. 1, Feb. 1985 (Year: 1985).*
Peng et al., "The Analysis of the Synthetic Range Profile Based on Doppler Filter Bank using FFT" Information Technology Journal 8 (8): 11 60-1 169, 2009 (Year: 2009).*

* cited by examiner

*Primary Examiner* — John C Kuan
(74) *Attorney, Agent, or Firm* — Patent Grove LLC; Tomas Friend

(57) ABSTRACT

A method for processing detection and range signals using a digital signal processor generates an interstitial filter that overlaps two adjacent baseline filters of filter bank. The interstitial filter is generated from data outputs of the two adjacent baseline filters using computations that are much simpler than those used to generate baseline filters. The inclusion of interstitial filters in the filter bank improves the resolution and signal to noise ratios of the filter bank.

8 Claims, 11 Drawing Sheets

*Prior Art*

$$A_n = \sum_{p=0}^{P-1} \hat{W}_{n,p} \bullet V_p$$

Where:
$V_p$ = Complex Voltage Measurement From Pulse "p"
$\hat{W}_{n,p}$ = Noise Normalized Complex Filter Weight For Filter "n" And Pulse "p"
p = Pulse Number
P = Number Of Samples = Number Of Pulses, Processed By Filter
n = Filter Number
N = Number Of Transform / Spectrum Filter Outputs (e.g., Filters)
$A_n$ = Complex Filter Amplitude Output

Fig. 6

*New Interstitial Filter Contributing Coefficients*

$$\hat{W}^+_{n,p} = \hat{W}_{n,p}$$

$$\hat{W}^-_{n+1,p} = \hat{W}_{n+1,p} \bullet e^{j\phi}$$

Where:
$\hat{W}_{n,p}$ = Traditional Normalized Doppler Filter Weight for Filter "n" from Pulse "p"
$\hat{W}_{n+1,p}$ = Traditional Normalized Doppler Filter Weight for Filter "n+1" from Pulse "p"
$\phi$ = Phasor Rotation Angle For Higher Frequency Traditional Doppler Filter
$\hat{W}^+_{n,p}$ = Interstitial Doppler Filter Weight Contribution From Lower Freqeueny Doppler Filter
$\hat{W}^-_{n+1,p}$ = Interstitial Doppler Filter Weight Contribution From Higher Freqeueny Doppler Filter

Fig. 7

*New Interstitial Filter Outputs*

$$801 \rightarrow \hat{W}^{\leftarrow}_{n+1/2,p} = \alpha\left[\hat{W}^{+}_{n,p} + \hat{W}^{-}_{n+1,p}\right] \quad \text{---}800$$

$$811 \rightarrow A_{n+1/2} = \sum_{p=0}^{P-1} \hat{W}^{\leftarrow}_{n+1/2,p} \bullet V_p \quad \text{---}810$$

$$820 \begin{cases} A_{n+1/2} = \sum_{p=0}^{P-1}\left[\alpha\hat{W}^{+}_{n,p}\bullet V_p + \alpha\hat{W}^{-}_{n+1,p}\bullet V_p\right] \\ A_{n+1/2} = \sum_{p=0}^{P-1}\left[\alpha\hat{W}_{n,p}\bullet V_p + \alpha\hat{W}_{n+1,p}\bullet e^{j\phi}\bullet V_p\right] \\ A_{n+1/2} = \alpha\sum_{p=0}^{P-1}\hat{W}_{n,p}\bullet V_p + \alpha\sum_{p=0}^{N-1}\hat{W}_{n+1,p}\bullet e^{j\phi}\bullet V_p \end{cases}$$

$$811 \rightarrow A_{n+1/2} = \alpha\left[A_n + A_{n+1}\bullet e^{j\phi}\right] \quad \text{---}850$$

or…

$$A_{n+1/2} = \alpha\left[A_n \bullet e^{-j\phi/2} + A_{n+1}\bullet e^{j\phi/2}\right] \quad \text{---}860$$

or…

$$A_{n+1/2} = \alpha\left[A_n e^{-j\phi'} + A_{n+1}\right] \quad \text{---}870$$

Where:
$\alpha$ = Noise Normalization Constant For New Interstitial Filter
$\hat{W}^{\leftarrow}_{n+1/2,p}$ = Interstitial Doppler Filter Weight For Frequency Between Frequency $F_n$ & $F_{n+1}$
$A_{n+1/2}$ = New Interstitial Filter Complex Amplitude For Frequency Between $F_n$ and $F_{n+1}$
$\phi$ = Phasor Rotation Angle For Higher Frequency Doppler Filter, Referenced Low $F_n$ Filter
$\phi'$ = Phasor Rotation Angle For Splitting Phase Between Adjacent Doppler Filters
$\phi''$ = Phasor Rotation Angle For Lower Frequency Doppler Filter, Referenced High $F_{n+1}$ Filter

Fig. 8

INTERSTITIAL FILTER SYSTEM AND METHOD WITH IMPROVED PERFORMANCE

CROSS REFERENCE TO RELATED APPLICATIONS

This application is a continuation-in-part of U.S. Ser. No. 14/015,594 filed Aug. 30, 2013, which claims the benefit of provisional application No. 61/712,803 filed Oct. 11, 2012, titled "Alternate Interstitial Filter Algorithm", which is incorporated herein by reference in its entirety.

The Federal Government has certain rights in the disclosed invention pursuant to contract no. W31 P4Q-07-A-0015/0003 awarded by Army Contracting Command.

BACKGROUND OF THE INVENTION

Field of the Invention

This application relates to methods and systems for filter bank signal processing, including extraction of spectral information from detection and range signals. The present invention provides specific methods and apparatus for improving Doppler radar detection and range and similar technologies that employ banks of filters.

Description of Related Art

Doppler radar uses the Doppler effect to produce velocity data about objects at a distance by bouncing a microwave signal off an object and analyzing how the object's motion alters the frequency of the returned signal. This information provides accurate measurements of the radial component of a objects velocity relative to the radar. For military and flight control applications, return signals reflected from precipitation, terrain, and countermeasures can be filtered out before detection. For low altitude objects, filtering on radial speed is an effective way to eliminate ground clutter, which always has a null speed. Pulse-Doppler radar combines long range and an ability to measure high velocity using a medium to high pulse repetition frequency (PRF). This allows detection of either high-speed objects or high-resolution velocity measurements. As a reflecting object moves between each transmit pulse, the returned signal has a phase difference, or phase shift, from pulse to pulse to produce Doppler modulation on the reflected signal, which allows the radar to separate the reflections from multiple objects located in the same volume of space by separating the objects using a spread spectrum to segregate different signals. LIDAR, sonar and acoustic detection and range systems similarly use Doppler shifts of light and sound waves in the same way.

Reflected signals are typically processed using a transform, or a bank of filters, applied to received and measured data. The output is usually in the form of signal magnitude (amplitude) and/or phase versus frequency. The resolution and sensitivity of signal processors is often limited by the number and the width of filters and resulting frequency bins in the bank of filters. The Signal to Noise ratio (SNR), Signal to Clutter Plus Noise Ratio (SCNR), and combined Signal to Noise, Clutter, and Interference Ratios (SNCIR) of the desired signal are limited by the hardware of the receiving sensor, the spectral width, and the spectral shape of the frequency bins. Adjacent frequency bins in the spectrum output from the signal processor exhibit a Cross Over Loss (COL) located at the edges of the frequency bins, which degrades the SNCIR of the desired signal if the signal happens to occur at the cross over frequency and imposes a net reduction in detection and classification performance. The problems of COL and the resulting degradation of SNCIR and performance are reduced, ameliorated and/or eliminated by the present invention.

BRIEF SUMMARY OF THE INVENTION

In one aspect, the present invention provides a method that improves detection and range systems. The method is implemented using an algorithm that is performed by a digital signal processor. The method lowers Cross Over Loss (COL) and improves signal to noise ratios in existing pulsed Doppler radar systems and other detection and range finding systems that process data through banks of filters. Software coding for the method steps of the algorithm is present on the digital processor or connected storage device and enables the processor perform the method. Without the improvement provided by the method implemented on a digital signal processor, the processor is not capable of lowering COL and improving SNR, SNCR, and/or SNCIR as achieved by use of the invention. In another aspect, the invention provides software for performing an algorithm on a digital signal processor for lowering COL and improving the performance of a pulse Doppler radar system and other systems using similar bins of filters.

The method involves the generation of interstitial frequency filters that are computed from the outputs of adjacent baseline filters in a bank of filters. The method of the invention can be applied to other continuous wave radar systems, Light Detection and Ranging (LIDAR) systems, Sound Navigation & Ranging (SONAR) systems, and acoustic detection and ranging systems that process data using banks of filters.

Implementation of the method reduces filter bank straddling loss with minimal additional computational burden on the signal processor of the receiving antenna, or sensor (e.g. LIDAR or SONAR sensor) because the calculations involved are much simpler than those used to generate baseline filters. Among other advantages, this allows interstitial filters to be implemented on existing digital signal processors that do not have the capacity for performing additional complex mathematical operations in real time. Additionally this has the benefit of providing improved sensitivity by functionally doubling the number of frequency bins and spectral resolution of the filter bank. In addition, the interstitial filters provide a degree of enhanced velocity resolution and a reduction in straddling loss.

BRIEF DESCRIPTION OF THE DRAWINGS

The elements of the drawings are not necessarily to scale relative to each other, with emphasis placed instead upon clearly illustrating the principles of the disclosure. Like reference numerals designate corresponding parts throughout the several views of the drawings in which:

FIG. 6 shows a general equation and parameter definitions for the output of a prior art digital filter used to create ABFs for a filter bank;

FIG. 7 shows filter coefficient equations and associated parameter definitions for use in a new interstitial filter equation;

FIG. 8 shows a derivation and equations that instantiate a new interstitial filter along with associated parameter definitions;

DETAILED DESCRIPTION OF THE INVENTION

Figure 1:
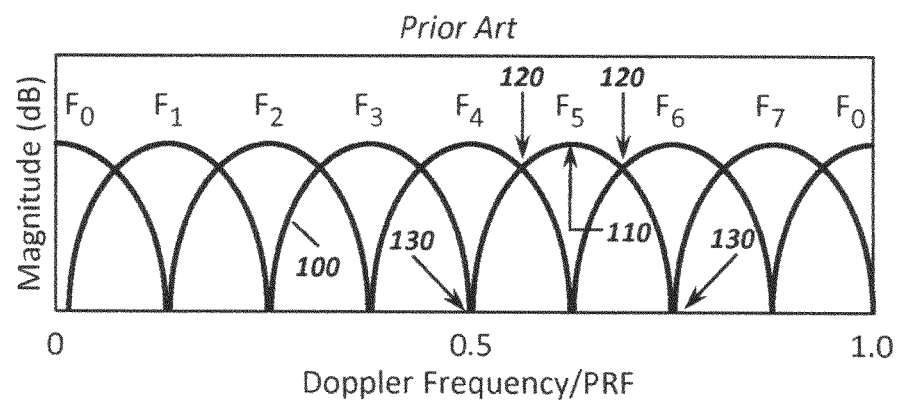
FIG. 1 is a graph of overlapping magnitude responses in decibels (dB) of a filter bank of eight overlapping Adjacent Baseline Filters (ABFs) versus Nyquist normalized frequency.
Figure 2:
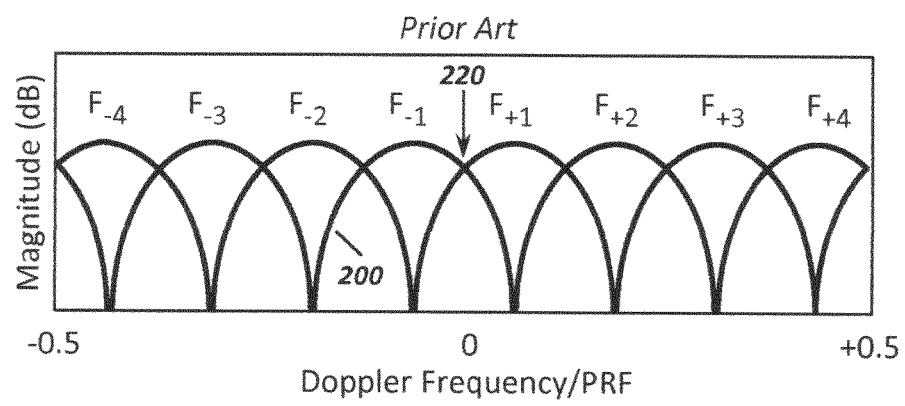
FIG. 2 is graph of overlapping magnitude responses in dB of a filter bank of eight overlapping ABFs versus Nyquist normalized frequency admitting both positive and negative frequencies.
Figure 3:
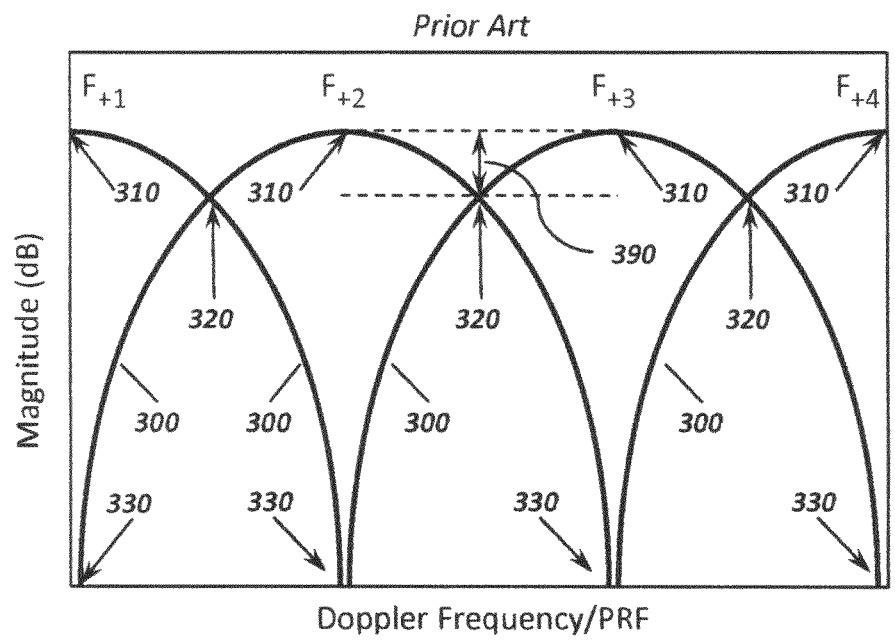
FIG. 3 depicts a close up view of the filters in FIG. 2 annotating key features and attributes of the filters.

The processing of Doppler radar signals, including the down conversion of received signals, the generation of filter banks, and how they are used to process signals, is well known in the art and is not described in detail herein. Relevant portions of the prior art process are shown in FIGS. 1-3 to aid in describing the invention and how it solved the problems of Cross Over Loss (COL) and the associated lowering of Signal to Clutter Plus Noise Ratio (SCNR), and/or Signal to Noise, Clutter, and Interference Ratios (SNCIR). FIG. 1 shows a graph of overlapping magnitude response curves for a conventional bank of eight overlapping baseline filters. The magnitude of the response is given in dB vs Doppler frequency divided by the Pulse Repetition Frequency (PRF), which is the sampling rate of the system. Above each individual filter 100 is a filter identifier "F" followed by a subscript containing the unique filter number (e.g., "$F_{+2}$"). A filter is defined between its primary nulls 130. Cross over points 120 between two adjacent filters define a frequency bin, and can be set to an arbitrary value through the design of the filter locations and shapes, but it is typically deigned to be −3 dB down from the peak gain 110 of the filter. The present invention uses the signal measured in both of two adjacent filters to generate a filter between them in frequency/PRF, or an interstitial filter. The adjacent filters preferably have a cross over gain at 120 of −3 dB with respect to the peak gain 110, but other gain values are possible with suitable adjustments to the invention by one skilled in the art of filter design.

FIG. 2 is a graph of overlapping magnitude response curves in a bank of eight overlapping filters admitting both positive and negative frequencies, scaled from negative half the maximum bandwidth (−PRF/2) through positive half the maximum bandwidth (+PRF/2). Relative to FIG. 1, the the filters 200 are shifted (or alternatively the frequency scale are shifted) to admit negative frequencies. The negative frequencies are associated with the Doppler frequency of radially egressing targets and the positive Doppler frequencies are associated with the Doppler frequency of radially approaching targets. The change of scale achieves symmetry in positive and negative Doppler filters with a partial overlapping response with the stationary clutter at zero frequency in the $F_{+1}$ and $F_{-1}$ filters at 220. Alternatively the filters 200 can be shifted by half a filter to place a null on the stationary clutter, normally also located at zero frequency in the spectrum, but potentially offset from zero frequency if the clutter is moving with respect to the Doppler radar. By moving or shifting the center null 220 around, one can adaptively move by shifting the frequencies of the filters and place a null on the clutter if and as it moves with respect to the clutter source, which may be due to wind, a moving weather phenomenon, or radar platform movement.

FIG. 3 is a close up view of the filters in FIG. 2. The peak response 310 of each filter 300 can be an uncompensated or non-normalized filter response, but it is usually normalized by the integral of the noise spectrum weighted by the filter, as well as by the spectrum of the expected signal. This follows the formalism of the matched filter, which the Doppler filter ideally approximates. The filter response for each filter crosses over the response of its neighbors at 320, referred to as the Cross Over Point (COP), and power level of the COP is down from the peak response 310 by the Cross Over Loss (COL) 390. The COL 390 is often about −3 dB for filters that are spaced according to their half power points. Filters may be spaced closer or further away from each other at increased cost to processing throughput or average sensitivity, or to achieve other system design goals such as filter splitting for accurately measuring velocity. The average (mean) loss down from the peak 310 between the filter peaks is the straddling loss. It represents a real loss to the whole filter bank in that, although it has local structure, statistically and without a priori knowledge of the location of the target signal (specifically its Doppler frequency), it is considered a flat loss across the whole spectrum. It is this straddling loss the present method reduces at a very low computational price compared, for example, to increasing the number or density of baseline filters. The straddling loss can be considered a mismatch loss in the sense that the target signal is not residing directly on the center of the filter 300, and the response will be frequency mismatched to some degree even with the closest filter. However, the mismatch loss is better defined by the spectrum of the ideal signal versus the spectrum of the filter and also the degree to which the target and noise spectra match in shape the spectrum of the filter in the matched filter sense.

Figure 4:
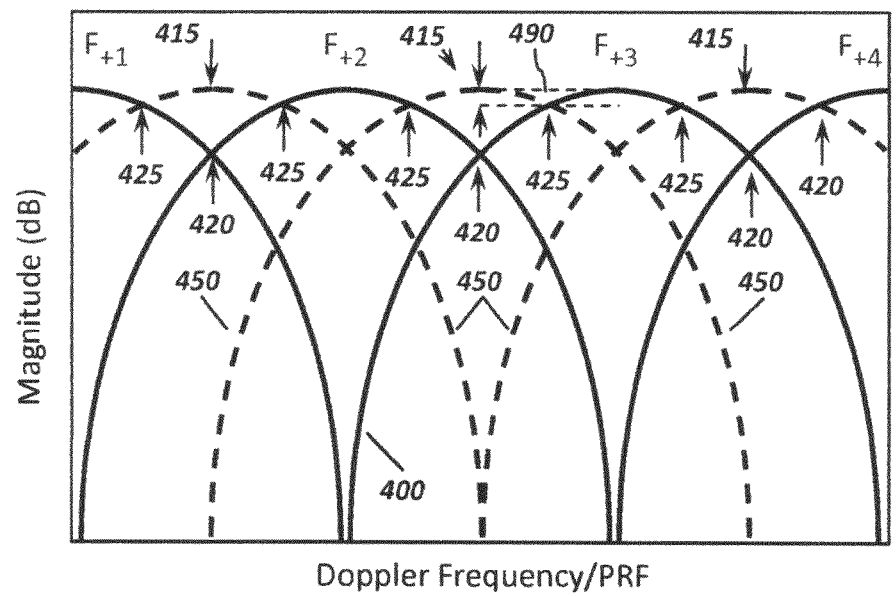
FIG. 4 depicts the concept of interstitial filters between original filters.

FIG. 4 is a close-up of the $F_{+2}$ and $F_{+3}$ filters similar to FIG. 3, but including interstitial filters 450 according to the invention between the original adjacent baseline filters, (ABFs), 400. The ABFs 400 are augmented with interstitial filters 450 that are placed to overlap with a number of the original ABFs 400, with peak responses 415 midway between the peak responses for the ABFs (310 in FIG. 3). This places an interstitial filter 450 in between each of the pairs of original filters 400 in the frequency domain, thereby reducing the COL from about −3 dB at 420 to 0 dB at 415. This provides a commensurate decrease in the mean straddling loss from about −0.83 dB at 390 to about −0.21 dB at 490, for a net +0.62 dB improvement in filter bank sensitivity, or a net +0.62 dB increase in Signal to Noise Ratio (SNR). If clutter is present, the phase noise of the system will produce clutter residue noise, which is added stochastically to thermal noise. In this instance, the improvement is in the Signal to Clutter Plus Noise Ratio (SCNR) instead of just the SNR. A similar argument holds when outside interference is added either from unintentional or intentional sources, in which case there is an improvement in the Signal to Clutter Plus Noise Plus Interference Ratio (SCNIR). Whatever the source components of any random noise may compete with the desired signal, the interstitial filter functions to improve the detectability of the signal against the competing noise.

Figure 5:
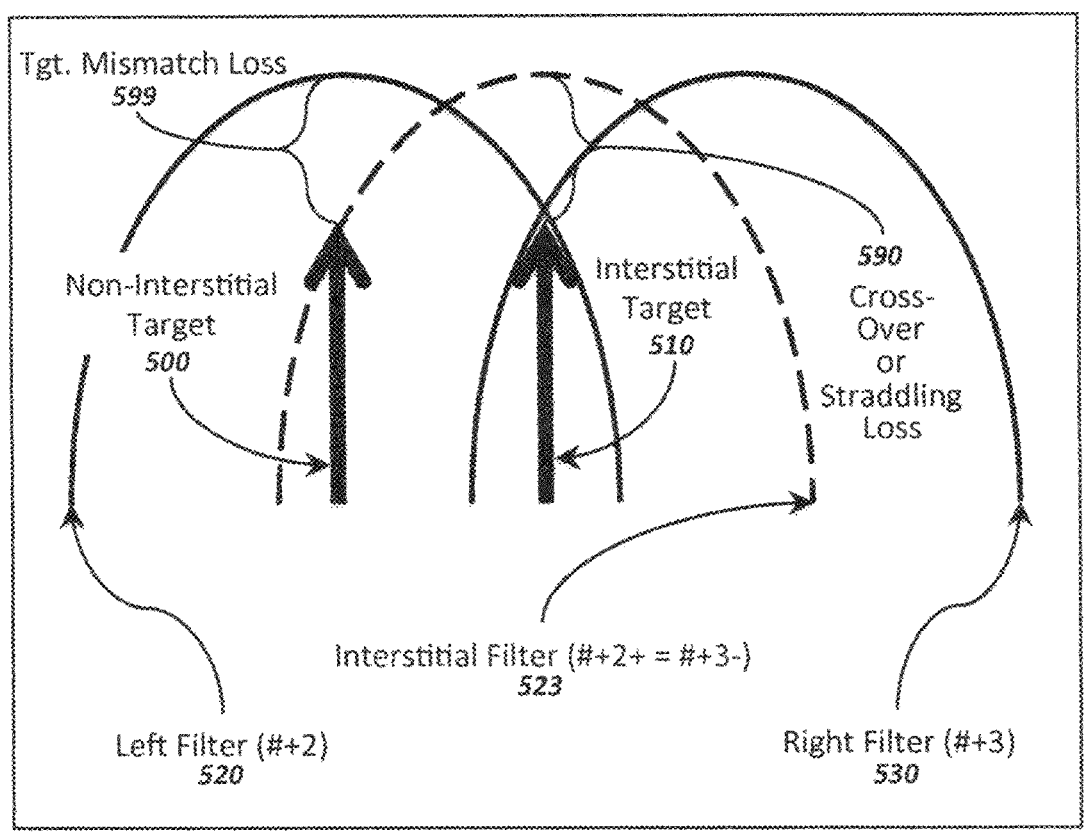
FIG. 5 is a closeup of ABFs $F_{+2}$ and $F_{+3}$ as well as an associated interstitial filter and illustrative interstitial and non-interstitial target signals.

FIG. 5 is a closeup showing examples of filters $F_{+2}$ and $F_{+3}$ as well as their associated interstitial filter and interstitial and baseline (non-interstitial) target signals. A target signal interstitial to the ABFs $F_{+2}$ 520 and $F_{+3}$ 530 experiences a COL 590. The average loss across the dip between 520 and 530 is the mean straddling loss. Interstitial filter $F_{+2/+3}$ 523 functions to recover the lost COL, and to reduce the mean straddling loss. Some mismatch loss 599 caused by the target frequency being shifted from either the baseline or the Interstitial filters 500 may remain, but compared to the alternative without the interstitial filter, the filter response is notably improved.

FIG. 6 shows the standard digital filter equation used to compute the ABFs for the Doppler filter bank. The present method employs outputs from the ABFs using an algorithm that provides a similar benefit as equation 600, but without the computational cost of actually computing interstitial filters using equation 600. FIG. 7 shows filter coefficient equations and parameter definitions that may be used to calculate an interstitial filter from the outputs of any pair of ABFs. A simple algebraic combination of ABF pair outputs are used to generate the interstitial filters, which means that computational cost is very low. For example, for a target signal 510 (FIG. 5) interstitial to filter pair 520 ($F_{+2}$) and 530 ($F_{+3}$), there is nominally a −3 dB response loss 590 in each of the pair of filters. Although the magnitude is the same in each filter, the phase angle from each filter will be different because the two adjacent filters are not coincident but are displaced from one another in frequency. Since the filter displacement in frequency space is known, an associated phasor angle between the two adjacent filters is computed.

Using the first filter 520 ($F_{+2}$) as the zero phase reference, its response to the interstitial target is the same as any other target within the filter except for the straddling loss. The contribution of the first filter 520 ($F_{+2}$) to the intestinal filter is a complex phasor the same as any target within the first filter 520 ($F_{+2}$), except down by the COL (about −3 dB), meaning the same filter coefficients can be used for this contribution to the interstitial filter from filter 520 ($F_{+2}$) as indicated in equation 700. For filter 530 ($F_{+3}$), except as noted above, its phase will be different from the first filter and will possess some phase difference −$\phi$ with respect to the first filter 520. Therefore, the same filter coefficients are assumed on the interstitial target 510 as for the second filter 530 ($F_{+3}$), except that the phase of the resultant complex phasor is counter rotated to line it up with the complex phasor output from the first filter 520 ($F_{+2}$) to make them coherent (in phase). Due to the linearity of the filter computation 600, this phaser angle difference is distributable down to the filter weights 605. The counter rotation is implemented with the exponential term in equation 710 and co-aligns the phaser output from filter 530 ($F_{+3}$) with the phaser output of filter 520 ($F_{+2}$).

FIG. 8 shows equations associated with generating an interstitial filter and the output of an interstitial filter. Equation 800 shows that two subordinate filter weights 700 and 710 (FIG. 7) are added along with a normalizing coefficient ox to produce a new interstitial filter weight 801. The filter weight replaces 605 in equation 600 to yield the interstitial filter equation 810, that computes the interstitial filter response 811. A summary equation 850 derived through equations 820 shows that the output phaser response of an interstitial filter 811 between the first ABF 520 ($F_{+2}$) and the second ABF 530 ($F_{+3}$) is proportional to the sum of the phasor outputs 611 from each of these filters, but with a compensating phasor rotation through an angle $\phi$ (710) applied to the second filter's phaser output as shown by the exponential term in 850.

Equations 860 and 870 show slightly different forms of equation 850 wherein the only difference is the zero reference for the second filter's output phaser phase angle −$\phi$. In equation 850, the reference for this phase angle is taken to be the phase of the first ABF, and the phasor output from the second ABF is compensated through the exponential term to de-rotate it through the angle $\phi$. In equation 860, the reference for the phase angle is taken to be interstitially between the two ABFs, and so the half angle phase $\phi'$ is employed to rotate each of the two filter outputs of the ABFs toward each other the same amount, to co-align in the middle. Finally, in equation 870, the second ABF is taken as the reference and so the first ABF is rotated in an opposite direction by an angle $\phi''=\phi$ into a co-aligned orientation for subsequent coherent addition. These forms are essentially identical except for choosing how to reference the rotation angle. A normalizing coefficient $\alpha$ multiplies the bracketed term of 850, 860, or 860 to normalize the output of the new interstitial filter to the same basis as the other filters in the filter bank.

Figure 9:
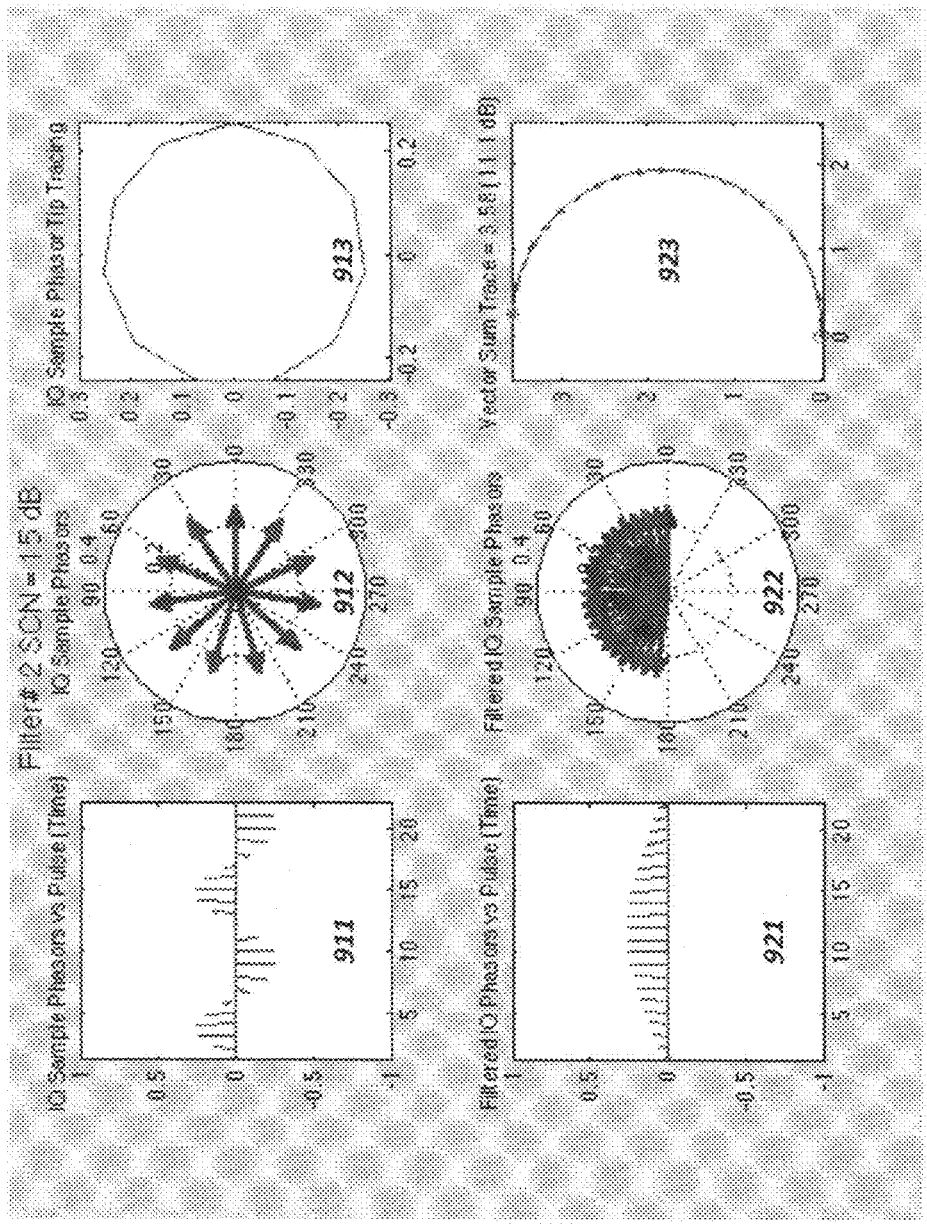
FIG. 9 shows intermediate results for the computation of filter $F_{+2}$ when the signal of interest is located interstitially midway between filters $F_{+2}$ and $F_{+3}$.

FIG. 9 shows intermediate through final results for the computation of filter $F_{+2}$ for an example in which the signal of interest is located at $(F_{+2}+F_{+3})/2$. The IQ sample phasers for each of 22 pulses in a dwell are shown in 911 along the time axis for the dwell, and the pulse amplitudes are defined so as to produce a 15 dB magnitude signal if they coherently add all in phase. The phasers trace out a sinusoid wave in 911 because they are wrapping a helix/cork screw about the time axis in the in-phase and quadrature voltage axes that are normal to the time axis. Eleven of the 22 individual pulse phasers can be seen in 912 where the view is looking down a central time axis. Only 11 pulse phasers are seen because they overlap the other 11 pulses in this example. The pulse phasers are seen to map out substantially a circle when plotted in the I (In-phase) and Q (Quadrature) voltage plot of 913.

After filtering with the $F_{+2}$ filter, most of the helix/cork screw has been unwound by the action of the $F_{+2}$ filter. As seen in 922 the phasers still have some partial rotation from about zero degrees to about 180 degrees in the counter clockwise direction. The coherent sum of these phasers is shown in 923 where, starting from about 6 o'clock and rotating counter clockwise to about 12 o'clock, the sum of the vectors map out a semicircle. The vector sum of these phasers is a vector from the starting point annotated by "o", to the end point annotated by "*", and this vector sum is the complex output of the filter. Due to the wide arc swept out by the phasers during the coherent sum performed in 923, the resultant vector sum has an amplitude length of 3.58, which is less than the sum of the magnitudes of the individual phasors, and corresponds to filter output of 11.1 dB in this example, versus the theoretically maximum gain of 15 dB injected into the filter. This represents a straddling loss of 3.9 dB for this $F_{+2}$ filter because the signal is located at $(F_{+2}+F_{+3})/2$, and not in the center of the filter at frequency $F_{+2}$ where it would give a maximum response without any straddling loss. In this example, the straddling loss is not 3 dB because the filters were not designed to provide a COL of 3 dB. This example illustrates that the filters need not be spaced exactly 3 dB apart, and that differences in bin spacing are accounted for in the normalization constants of the filters.

Figure 10:
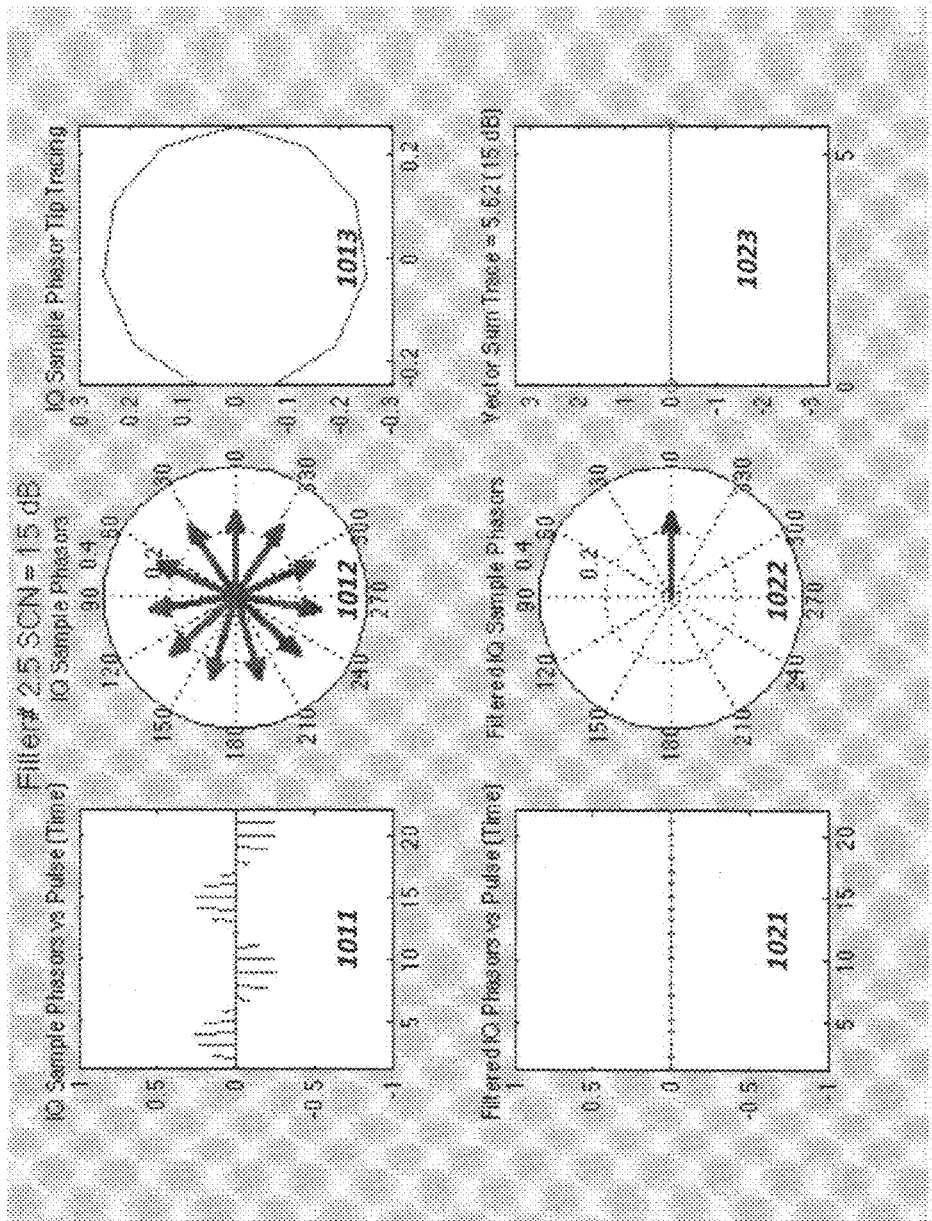
FIG. 10 shows intermediate results for a computation of a new interstitial filter midway between filters $F_{+2}$ and $F_{+3}$ computed the traditional way, when the signal of interest is located also interstitially midway between filters $F_{+2}$ and $F_{+3}$.

FIG. 10 shows intermediate through final results for the computation of an interstitial filter midway between filters $F_{+2}$ and $F_{+3}$ at frequency $(F_{+2}+F_{+3})/2$, computed when the signal of interest is also located at frequency $(F_{+2}+F_{+3})/2$. Plots 1011, 1012, 1013, 1021, 1022, and 1023 show the same types of data as previously described for plots 911, 912, 913, 921, 922, and 923, for this interstitial fitter at frequency $(F_{+2}+F_{+3})/2$. All of the pulse phasers are aligned with each other at the same phase angle. This may be more clearly seen in 1022, where all 22 of the pulse phasors are laying on top of each other at zero degrees phase after application of the fitter, resulting in the pulse phasors lying end to end in 1023 to form a straight line amplitude vector with maximum length 5.62 corresponding to the 15 dB signal injected into the filter.

Figure 11:
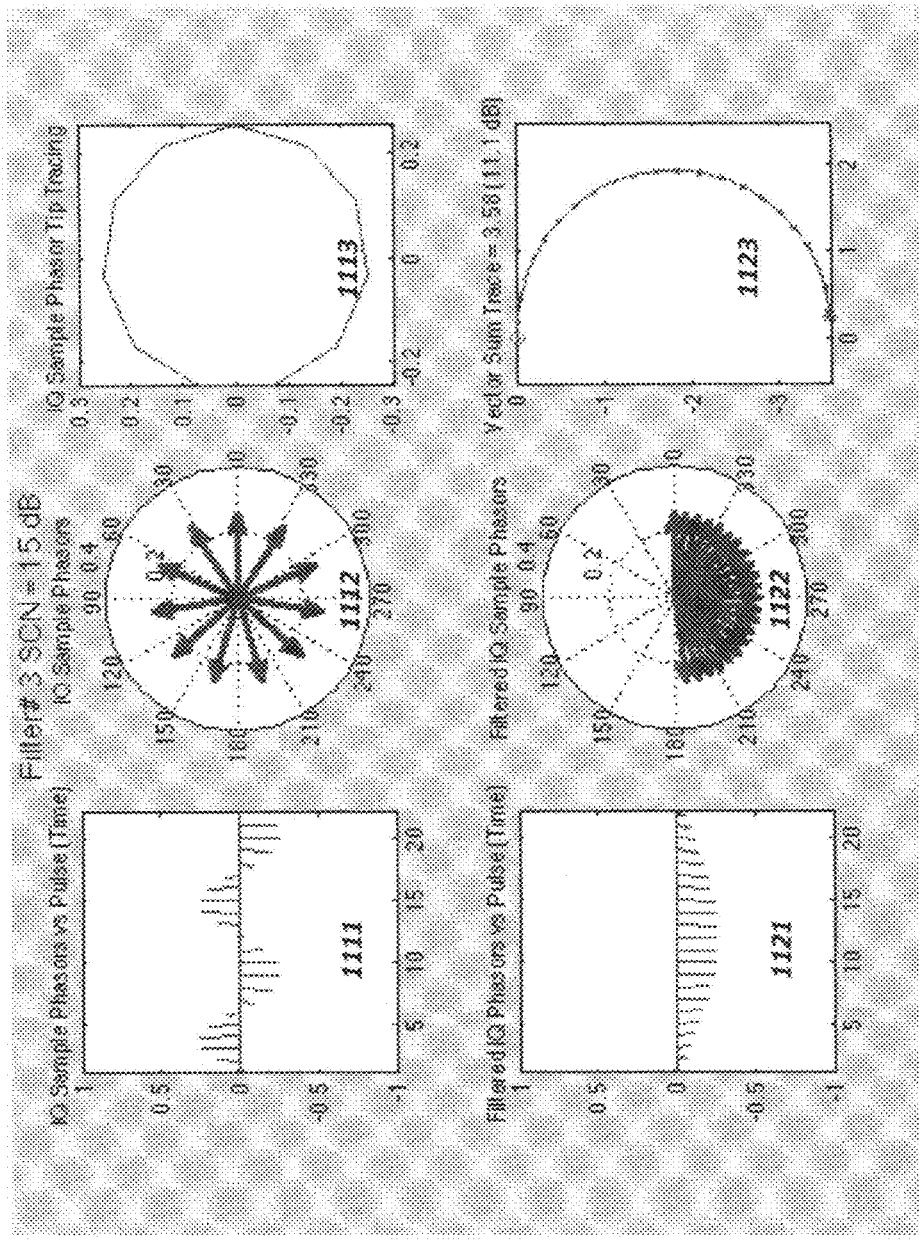
FIG. 11 shows intermediate results for a computation of filter $F_{+3}$ when a signal of interest is located interstitially midway between filters $F_{+2}$ and $F_{+3}$.
Figure 12:
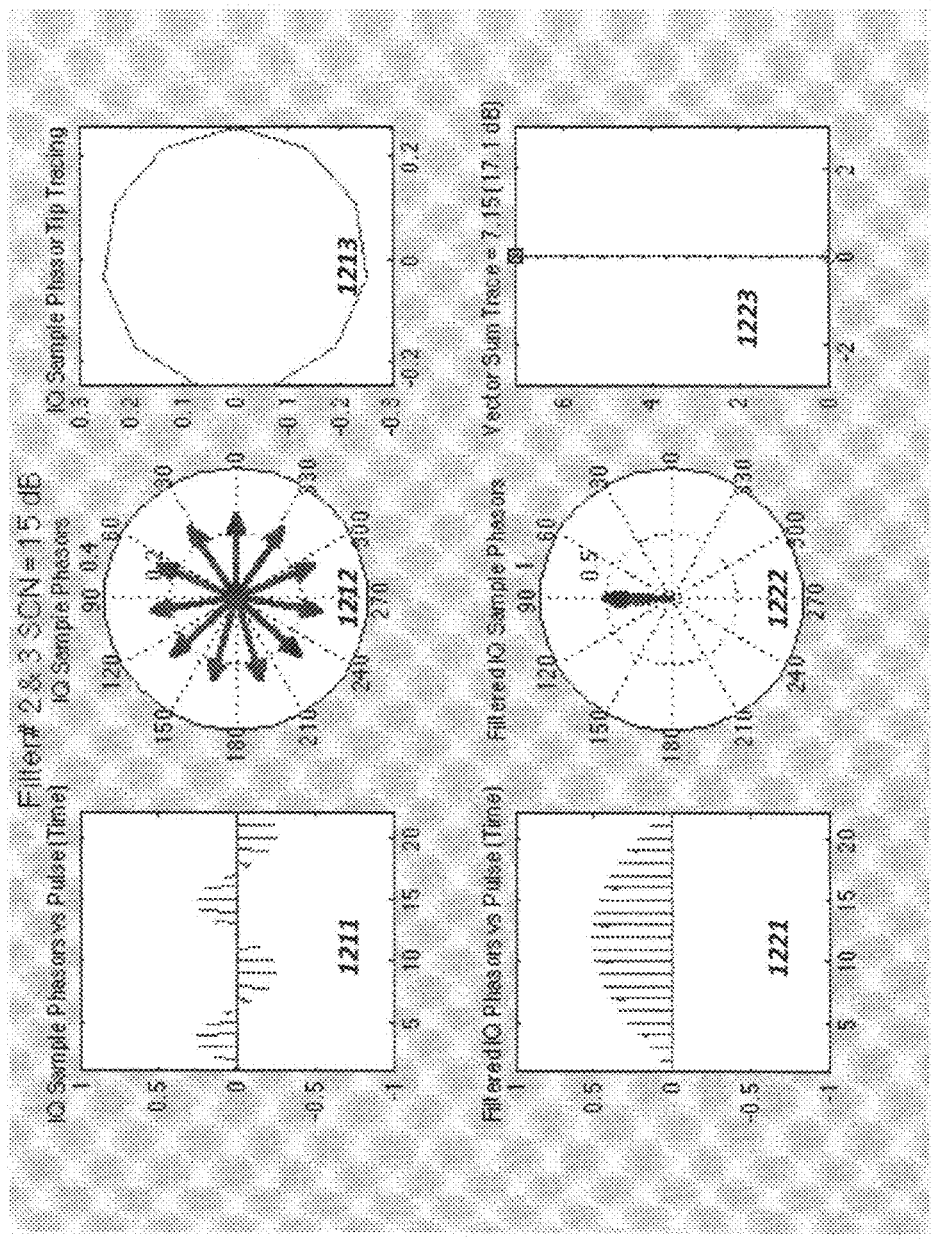
FIG. 12 shows intermediate and final results for a computation of a new interstitial filter midway between filters $F_{+2}$ and $F_{+3}$ computed according to an embodiment of the invention, when the signal of interest is located also interstitially midway between filters $F_{+2}$ and $F_{+3}$.

FIG. 11 shows intermediate through final results for the computation of filter F, when the signal of interest is located at $(F_{+2}+F_{+3})/2$. Plots 1111, 1112, 1113, 1121, 1122, and 1123 show the same types of data as previously described for plots 911, 912, 913, 921, 922, and 923, with the other ABF at frequency $F_{+3}$. Plots 1121, 1122 and 1123 are essentially mirror images of plots 921, 922, and 923, showing that the pulse phasers have been rotated in phase essentially 180 degrees between the $F_{+2}$ filter and the $F_{+3}$ filter, but otherwise the filter amplitude responses and relative phases are the same. The degree of phase difference between the $F_{+2}$ filter and the $F_{+3}$ filter may vary according to the specifications of the individual filters, but will always be a predictable or determinable value FIG. 12 shows the intermediate and final results for the computation of a new interstitial filter at $(F_{+2}+F_{+3})/2$, according to the invention. The signal of interest in this example is located at frequency $(F_{+2}+F_{+3})/2$. The known value of phase difference $-\phi$ between the two ABFs is used to rotate the phase of the output phaser from the second ABF at $F_{+3}$ so that it may be constructively added to the filter output phaser of the first ABF at $F_{+2}$ to provide the new Interstitial filter. This is accomplished using a simple mathematical combination of the prior computed filter outputs according to equation 850 instead of recomputing an entire Interstitial filter separately using equation 600. The resultant output phaser has a phase of 90 degrees as seen in 1222 because the filter weights of the $F_{+3}$ fitter are rotated into the reference frame of the $F_{+2}$ filter. When the two complimentary resultant weights are added according to equations 850, the residual clockwise and counter clockwise rotations of the filter weights cancel, resulting in all the filter weights lying in one direction. After processing the pulse phasor data with the new interstitial filter, all the pulse phasers lie end to end in a line as shown in plot 1223, and produce a coherent addition of 7.15 or 17.1 dB. No normalizing constant is used in this computation. Given an input signal of 15 dB, one might expect the output of the interstitial filter to be 18 dB because signals from both the ABFs were summed without normalizing coefficients. The 17.1 dB result is 6 dB above the non-interstitial result of 11.1 dB and arises from doubling the amplitude of the phaser due to the coherent addition of aligned phasers, which equates to a factor of 4 power increase (i.e. 6 dB). The reason for this is that signal power and not SNR is computed. The SNR would only double for a coherent process because of cancellation in the denominator from noise increase.

Figure 13:
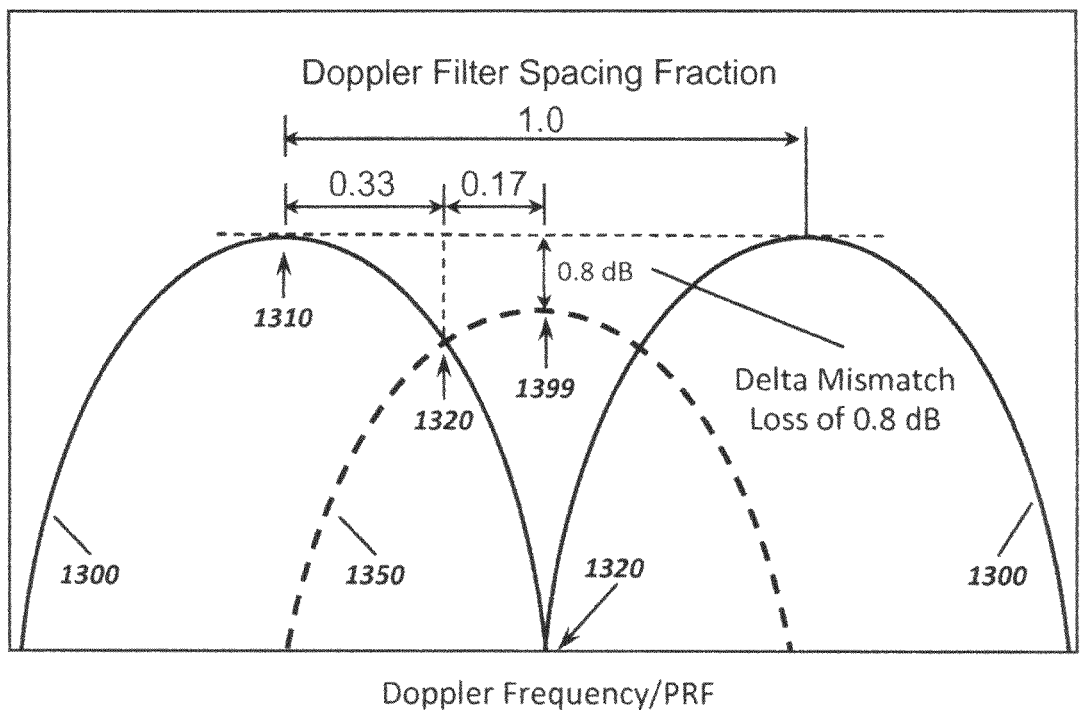
FIG. 13 illustrates a straddling loss associated with a new interstitial filter.

FIG. 13 shows net mismatch and straddling losses associated with the interstitial filter relative to adjacent ABFs 1300. In this example, the $\alpha$ constant in FIG. 8 equation 850 may be estimated because the target signal is located at the cross over point 1320 between the two ABFs and the two adjacent filters have a −3 dB COL at the cross over frequency at 1320. About half the noise contribution into the interstitial filter comes from each of the two ABFs. Noise at the cross over frequency from each of the two ABFs is 100% correlated at that frequency so that part of the noise spectrum counts twice when summed together because this is a coherent process. However, the noise contributions from spectral locations distant from the cross over point are not well correlated, introducing a root mean square sense with a factor of $\sqrt{2}$. The result of this is that halt of the cumulative noise in the interstitial filter is due to coherent addition of the noise power from the two ABFs, and is haft due to the non-coherent addition of noise from the two ABFs that straddle the interstitial filter:

$$N_{INT} = \left[\frac{1}{2}2N_n + \frac{1}{2}\sqrt{2}\,N_n\right] = \frac{1}{4}3.414N_n^2 = 1.707N_n^2$$

where $N_{INT}$ is the noise power in the New Interstitial Fitter, $N_n$ is the noise power in one or the other of the ABFs, the coefficient "2" represents the coherent addition of the noise power from the ABFs and the coefficient "$\sqrt{2}$" represents the non-coherent addition of noise power from the ABFs. This noise increase in the interstitial filter is equivalent to a 2.32 dB loss in SNR, which lessens the response of the filter upon normalization. Thus the previously computed coherent signal increase for the interstitial filter of 17.1 dB is reduced by 2.32 dB of noise to provide an estimated SNR of 14.78 dB, which is essentially equal to the expected 15 dB value when taking into account the simplicity of the noise estimate above. A numerical computation for one example of Doppler filters computes an additional real mismatch loss of about 0.8 dB as illustrated in FIG. 13 at 1399. This is a result of the changes in noise, signal, and filter spectral responses within the interstitial filter in the matched filter sense. However, when this mismatch loss is averaged over the dip between the ABFs, the mean straddling loss is found to be only −0.06 dB lower than without this mismatch loss. This is a small difference within the context of a complex sensor system.

Figure 14:
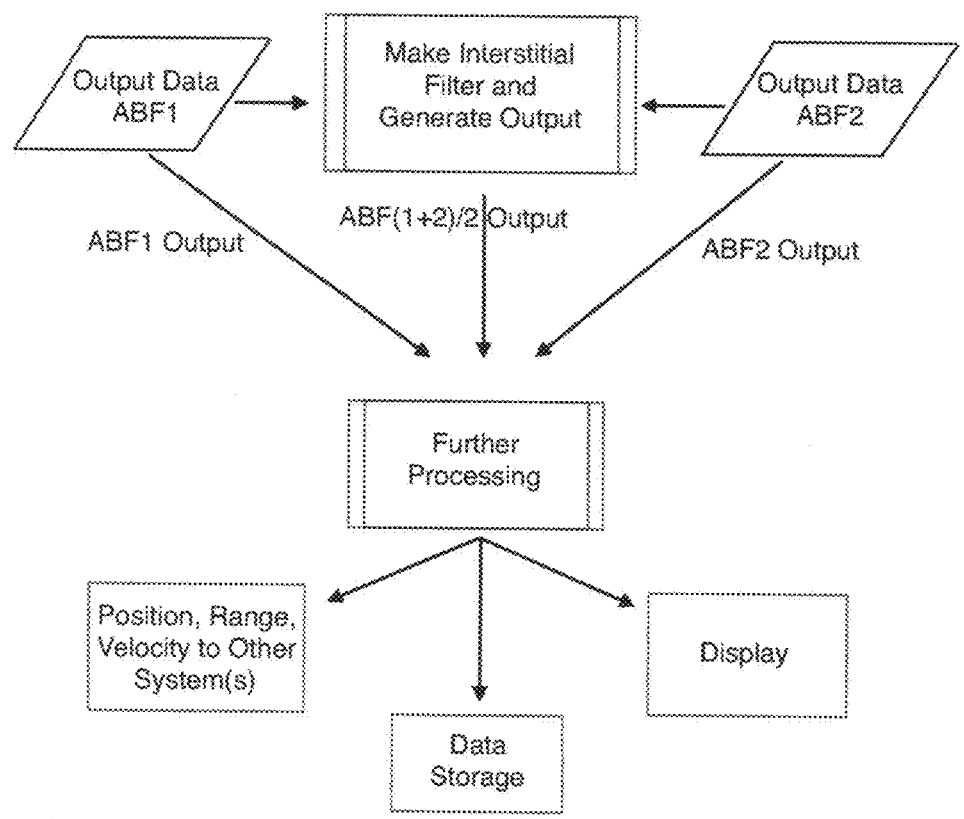
FIG. 14 is a flowchart showing data flow in a method according to the invention.

FIG. 14 shows the flow of data during signal processing of radar data from two adjacent ABFs, ABF1 and ABF2, and an interstitial filter between them. Software encoding an interstitial filter generator uses data from the two adjacent ABFs to generate the filter and to produce the output from the interstitial filter. Output data from the two ABFs and the interstitial fitter are then used for further processing as if the interstitial filter had been present as an original ABF, essentially increasing the resolution of the filter bank. For example, if a filter bank contains 10 ABFs, the method generates 9 interstitial filters and data from 10 ABFs and 9 interstitial filters for a total of 19 filters is used for further processing of the radar data. The frequency associated with each of the interstitial filters is optimally a frequency half way between the two ABFs. The extra 9 filters come at a computational cost that is much less than generating an additional 9 ABFs. This is because generating each interstitial filter only requires a complex multiplication of exp(−iφ) with a first complex summed phaser output from a first ABF, a complex addition of the result with a second complex summed phasor output from a second ABF, a complex conjugate application to the result, and a complex multiplication of the conjugated result with the complex summed phasor output from the second ABF The result is a power value for the interstitial filter with much smaller computational expense than computing an extra ABF covering the same frequency range. The presence of the interstitial filters improves signal to noise ratios and thereby improves the performance of the radar system. The method as well as coded instructions for performing the method can be applied to other detection and range systems that use the same types of filters banks as the pulse Doppler radar system used herein to describe the method.

The description focuses on the introduction of an interstitial filter located centrally between each pair of pre-existing ABFs in a filter bank. By changing the normalized weightings of the adjacent filter contributions to the interstitial filter, however, the interstitial filter may be moved in frequency to any desired frequency between any two ABFs. Using this technique, some finer filter splitting spectral analysis may be performed without changing the spectral resolution of the filters. A plurality of interstitial filters may be created to reduce straddling losses even further. For example, one may create two additional interstitial filters, one to either side of a first interstitial filter located midway between two adjacent ABFs. This process of adding additional interstitial filters between previously computed interstitial filters and between an interstitial filter and one of the two ABFs in the filter bank may theoretically be repeated without limit, but a point of diminishing returns is reached after the first interstitial filter.

Based upon the description of the invention presented, it should be understood that the present invention scales to higher dimensionality filter banks. For example, a two dimensional embodiment of the invention introduces interstitial filters between pairs of ABFs in each of the rows of a two dimensional filter bank, as well as between pairs of ABFs in the columns of a two dimensional filter bank. It involves the addition of interstitial filter between the adjacent filters in each of the two substantially orthogonal diagonals. In this way, the net effective two dimensional mean straddling loss is reduced by an average of about 0.6 dB in each independent dimension for a total of 1.2 dB, and the two dimensional frequency resolution is increased at the same time. Similar extensions along these lines apply to three or higher dimensions.

The invention claimed is:

1. A method for processing detection and range signals using a digital signal processor configured to implement a filter bank comprising a series of adjacent baseline filters with received reflected signals, said method comprising:

in said digital signal processor filter bank:
generating an interstitial filter that overlaps a first baseline filter and a second baseline filter of an adjacent pair of baseline filters by combining a first filter output of the first baseline filter and a second filter output of the second baseline filter;
using the interstitial filter to detect frequency components between frequencies of the first and second baseline filters and to produce a third output;
including the third output with the first and second outputs in further processing of the detection and range signals;
producing a detection and range output from the further processed detection and range signals;
wherein:
the output is selected from the group consisting of: a continuous wave radar detection and range output, a pulse Doppler detection and range radar output, a Light Detection And Ranging (LIDAR) detection and range output, a Sound Navigation And Ranging (SONAR) detection and range output, and an acoustic detection and range output.

2. The method of claim 1, wherein the detection and range signals are pulse Doppler radar signals and the detection and range output is a pulse Doppler radar output.

3. The method of claim 1, wherein said first and second filter outputs each comprises a phasor output and wherein generating an interstitial filter further comprises combining phasor outputs from the first and second outputs to generate a coherent third phasor output.

4. The method of claim 3, wherein said combining phasor outputs from the first and second filter outputs comprises rotating a frequency of said second phasor output by a phasor angle toward a frequency of said first phasor output to bring phasors angles of the first and second phasor outputs into alignment and adding said first and second phasor outputs, and
wherein the coherent third phasor output comprises an amplitude output of the interstitial filter.

5. The method of claim 1, wherein said combining a first filter output of the first baseline filter and a second filter output of the second baseline filter comprises summing a weighted first filter output and a weighted second filter output and multiplying a resulting sum by a normalizing coefficient.

6. The method of claim 5, wherein said combining a first filter output of the first baseline filter and a second filter output of the second baseline filter further comprises assigning a first filter weight to the first filter output and a second filter weight to the second filter output.

7. A receiver for a pulse Doppler radar system, said receiver comprising a digital signal processor configured to perform the method of claim 2.

8. A non-transitory storage medium that is configured to store software for improving the performance of a digital signal processor configured to implement a filter bank comprising a series of adjacent baseline filters, the software comprising:
a program module configured to:
for each pair of adjacent baseline filters, generate an interstitial filter that overlaps a first baseline filter and a second baseline filter by combining a first filter output of the first baseline filter and a second filter output of the second baseline filter and
detect frequency components between frequencies of the first and second baseline filters to produce an interstitial filter output for further processing along with outputs from the first and second baseline filters.

* * * * *